July 17, 1951 L. J. GIACOLETTO 2,561,109

SEMICONDUCTOR DEVICE

Filed March 29, 1950

Inventor
Laurence J. Giacoletto

By H. W. Newton

Attorney

Patented July 17, 1951 2,561,109

UNITED STATES PATENT OFFICE 2,561,109

SEMICONDUCTOR DEVICE

Lawrence J. Giacoletto, Eatontown, N. J., assignor to Radio Corporation of America, a corporation of Delaware Application March 29, 1950, Serial No. 152,677

4 Claims. (Cl. 175—366)

This invention relates to semi-conductor devices and to a method of manufacture of semiconductor devices, and particularly relates to a method for providing a semi-conducting material with a plurality of rectifying contacts.

A semi-conductor device which will provide an amplifier or oscillator comprises a semi-conducting material such as a germanium crystal and a plurality of electrodes in contact with the crystal. Thus, a base electrode is in low-resistance, non-rectifying contact with the crystal while an emitter and collector electrode are in rectifying, high-resistance contact with the crystal. A device of this type has been called a transistor. In the past, difficulties have been experienced in positioning the rectifying electrodes, that is, the emitter and collector electrodes on the crystal. These electrodes are normally spaced apart no more than a few mils and usually consist of fine pointed wires. The wires are usually spaced by hand and their spacing must be carefully checked because the performance of the device depends on the distance between the emitter and collector electrodes. Accordingly, it is desirable to provide a method adapted for large scale production of such semi-conductor devices.

It is accordingly an object of the present invention to provide a novel method of manufacturing semi-conductor devices suitable as amplifiers or oscillators and to provide improved semi-conductor devices prepared in accordance with the method.

A further object of the invention is to provide an improved method of providing a semi-conductor device with a plurality of rectifying or small-area contacts.

Another object of the invention is to provide an improved method of manufacturing semi-conductor devices of the type referred to which is adapted for large scale production.

A semi-conductor device in accordance with the invention includes an elongated electrically conductive member such as a metallic rod having a groove into which a bar of semi-conducting material such as germanium crystal is inserted. A portion of the bar extends above the rod. The portion of the bar which extends above the rod is ground and polished to provide a sharp edge on the bar which extends substantially parallel to the axis of the rod. The exposed surface of the rod is then provided with a surface layer of insulating material. Thereupon, two or more metallic or otherwise electrically conductive wires are wound about the rod and across the edge of the bar with predetermined pitch. Finally, these wires are anchored to the rod and suitable portions are cut from the bar and the rod, each portion having at least one rectifying contact between each wire and the bar. Since each wire stretches across a sharp edge of the germanium crystal, the contact between the wire and the crystal is substantially a point contact which has rectifying properties. The novel method of the invention makes it possible to utilize the technique developed for winding the grids for vacuum tubes so that the rectifying contacts may be applied with uniform spacing by a machine instead of by hand.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
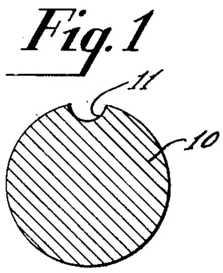
Figures 1 to 5 are cross-sectional views showing progressive steps in the manufacture of a semiconductor device in accordance with the invention.

Referring now to the drawing in which like components have been designated by the same reference numerals, and particularly to Figure 1, there is illustrated a metallic rod 10 which consists of a metal which is a good conductor of electricity such as copper. Rod 10 preferably is of circular cross section as shown and may have a diameter of between one-fourth and one-eighth of an inch. Rod 10 is provided with a semi-circular groove 11 which is cut parallel to the axis of rod 10.

Figure 2:
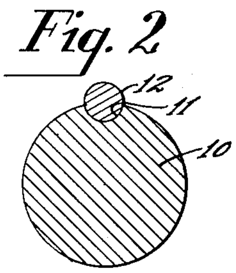
Figure 3:
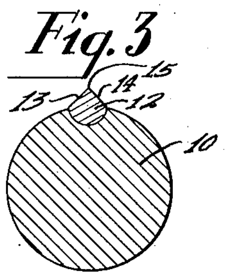

As shown in Figure 2 a substantially circular bar 12 of semi-conducting material is soldered to groove 11 of rod 10. Bar 11 may, for example, consist of a germanium crystal which may be of the N-type. The next step is to grind and polish the portion of bar 12 which extends above rod 10. As clearly shown in Figure 3, two angularly disposed flat surfaces 13 and 14 are formed which intersect to provide a sharp edge 15 which extends substantially parallel to the axis of rod 10. Preferably, faces 13 and 14 and edge 15 are chemically etched or electrolytically treated as is conventional in the manufacturer of a semi-conductor device suitable as an amplifier or oscillator.

Figure 4:
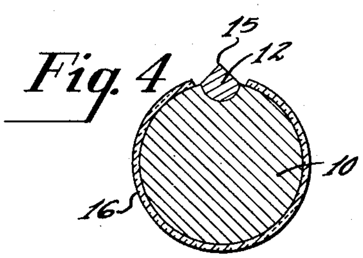

As illustrated in Figure 4, the outer or exposed surface of rod 10 is provided with an insulating layer 16. This may, for example, be effected by spraying rod 10 with or dipping the rod 10 into a suitable insulating material such as glass, a suitable plastic material or Formex.

Figure 5:
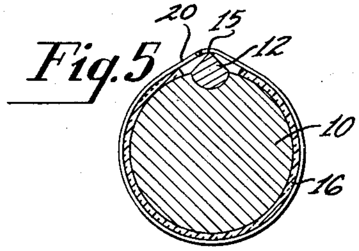

The insulating bar stock is inserted into a machine of the type used for winding the grid of a vacuum tube. This machine is arranged to wind two wires 20, 21 (see Figs. 5 and 6) about rod 10 and bar 16. Wires 20 and 21 may, for example, consist of small diameter tungsten or phosphor bronze wires. The number of turns per inch preferably is very high and the wires are spaced apart approximately a few mils. As clearly shown in Figure 5, wires 20 and 21 stretch across edge 15 of bar 12. Thus, there is substantially a rectifying point contact between each wire 20 or 21 and edge 15 of bar 12. When wires 20 and 21 are wound about the bar stock, insulating layer 16 is notched slightly which will facilitate the positioning of the wires. Furthermore, the wires are preferably anchored to rod 10 by means of a suitable cement which may cover insulating layer 16.

Figures 6, 7:
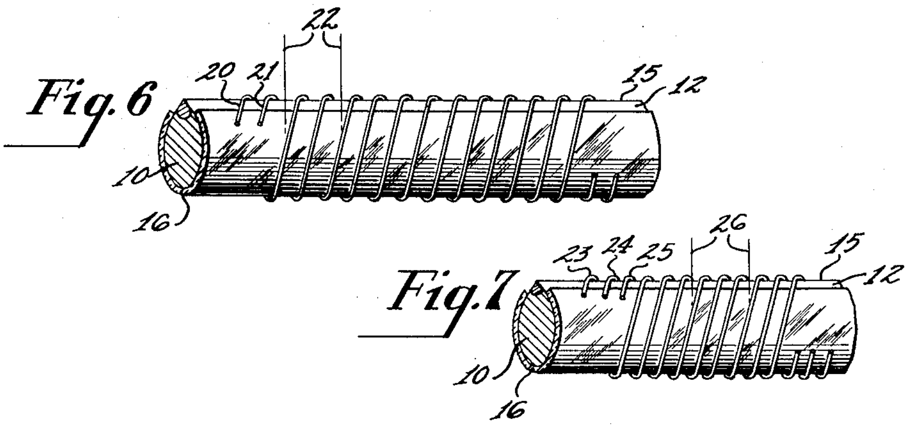
Figure 6 is an elevational view of a semi-conductor device embodying the present invention and having two wires wound spirally about a metallic rod and semi-conducting bar.
Figure 7 is an elevational view of a modified device in accordance with the invention having three parallel wires wound helically about the rod and bar.

As indicated by lines 22 in Figure 6 the bar stock is now cut into sections of desired length. Thus, as shown in Figure 6, each section may have a single contact between each wire 20 and 21 and bar 12. In that case, rod 10 provides the base electrode and wires 20, 21, the emitter and collector electrodes, respectively. However, it is also feasible to cut off sections of such a length that, for example, the wire 20 has two contacts with bar 12. A device of this type may be utilized to provide, for example, two emitter electrodes and one collector electrode. The two emitter electrodes may be connected together. It is, of course, feasible to provide a plurality of contacts between each wire 20 or 21 and bar 12.

At either or both ends of the cut portions of the bar stock the cut wires 20 and 21 may be folded back and welded to a suitable contact electrode. The device is now ready for use.

It is also feasible to provide a semi-conductor device having three wires 23, 24 and 25 wound parallel to each other about rod 10 and bar 12, as shown in Figure 7. Lines 26 indicate the places where the stock may be cut to provide a semi-conductor device having three separate rectifying contacts. Each of the sections cut from the stock illustrated in Figures 6 and 7 may be used as an individual amplifier or oscillator, and each wire helix 20, 21 or 23, 24, 25 becomes one electrode of the device which is in rectifying contact with bar 12. It is to be understood that more than three wires may be wound about rod 10 and bar 12, if desired.

In the event one of the electrodes is to receive electrical treatment as is customary for transistors, this may be accomplished before the rod is cut into sections so that all sections are treated simultaneously and identically.

There has thus been disclosed a novel method of manufacturing such semi-conductor devices which permits the utilization of a grid winding machine. Thus, the rectifying contacts are positioned mechanically instead of by hand which permits large scale production. The invention also provides a novel device manufactured in accordance with the method disclosed herein.

What is claimed is:

1. A semi-conductor device comprising a metallic member having an elongated groove therein, a bar of semi-conducting material provided in said groove, said bar having an edge substantially parallel to said groove and disposed beyond said member, an insulating layer covering the exposed surface of said member, and at least two wires disposed spirally about said member and extending across said edge to provide rectifying contacts between said wires and said bar.

2. A semi-conductor device comprising a metallic member having an elongated groove therein, a bar of semi-conducting material provided in said groove, said bar having a wedge shape portion with an edge substantially parallel to said groove and extending beyond said member, an insulating layer covering the exposed surface of said member, and at least two wires disposed spirally about said member and extending across said edge to provide rectifying contacts between said wires and said bar.

3. A semi-conductor device comprising a metallic rod having a groove therein substantially parallel to the axis of said rod, a bar of semi-conducting material provided in said groove, said bar having an edge substantially parallel to said axis and disposed beyond said member, an insulating layer covering the exposed surface of said member, and at least two wires disposed spirally about said member and extending across said edge to provide at least one rectifying contact between each of said wires and said bar.

4. A semi-conductor device comprising a metallic rod having a groove therein substantially parallel to the axis of said rod, a bar of semi-conducting material provided in said groove and being in low-resistance contact with said rod, said bar having a portion with angularly disposed faces forming an edge substantially parallel to said groove and extending beyond said member, an insulating layer covering the exposed surface of said member, and three wires disposed spirally about said member and extending across said edge to provide at least one rectifying contact between each of said wires and said bar.

LAWRENCE J. GIACOLETTO.

No references cited.